(12) United States Patent
Ueno et al.

(10) Patent No.: US 11,189,746 B2
(45) Date of Patent: Nov. 30, 2021

(54) PHOTODETECTOR COMPRISING DUAL CELLS WITH DIFFERENT THICKNESS OF INTERPOSING SUBSTRATES, PHOTODETECTION DEVICE, LASER IMAGING DETECTION AND RANGING APPARATUS AND METHOD OF MANUFACTURING A PHOTODETECTOR

(71) Applicant: Kabushiki Kaisha Toshiba, Minato-ku (JP)

(72) Inventors: Risako Ueno, Fujimino (JP); Kazuhiro Suzuki, Meguro (JP); Yuki Nobusa, Yokohama (JP); Jiro Yoshida, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 948 days.

(21) Appl. No.: 15/907,899

(22) Filed: Feb. 28, 2018

(65) Prior Publication Data

US 2019/0088814 A1    Mar. 21, 2019

(30) Foreign Application Priority Data

Sep. 20, 2017   (JP) .............................. JP2017-180201

(51) Int. Cl.
*G01S 17/88*    (2006.01)
*H01L 31/14*    (2006.01)
(Continued)

(52) U.S. Cl.
CPC .......... *H01L 31/145* (2013.01); *G01S 7/4816* (2013.01); *G01S 17/88* (2013.01);
(Continued)

(58) Field of Classification Search
CPC ........... H01L 27/14605; H01L 27/1463; H01L 31/145; H01L 31/18; G01S 17/88; G01S 7/4868
(Continued)

(56) References Cited

U.S. PATENT DOCUMENTS 4,405,857 A * 9/1983 Hirai ...................... H04N 1/03
250/208.1
8,916,945 B2   12/2014 Sakamoto et al.
(Continued)

FOREIGN PATENT DOCUMENTS

JP         5-95127 A      4/1993
JP         7-3881         1/1995
JP         2013-93609     5/2013

*Primary Examiner* — Que Tan Le
(74) *Attorney, Agent, or Firm* — Oblon, McClelland, Maier & Neustadt, L.L.P.

(57) ABSTRACT

A photodetector includes a first cell for converting incident light into electric charges, the first cell including a first semiconductor layer, a second semiconductor layer and a first substrate interposing the first semiconductor layer with the second semiconductor layer; and a second cell for converting incident light into electric charges, the second cell including a third semiconductor layer, a fourth semiconductor layer, and a second substrate interposing the third semiconductor layer with the fourth semiconductor layer; wherein the second substrate is larger in thickness than the first substrate.

12 Claims, 6 Drawing Sheets

(51) Int. Cl.
*H01L 31/18* (2006.01)
*G01S 7/481* (2006.01)
*H01L 31/107* (2006.01)
*G01S 7/486* (2020.01)

(52) U.S. Cl.
CPC ............ *H01L 31/107* (2013.01); *H01L 31/18* (2013.01); *G01S 7/4868* (2013.01)

(58) Field of Classification Search
USPC .......................................... 250/214.1, 208.1
See application file for complete search history.

(56) References Cited

U.S. PATENT DOCUMENTS

2007/0262364 A1   11/2007   Hsu et al.
2016/0005913 A1    1/2016   O'Neill et al.

\* cited by examiner

PHOTODETECTOR COMPRISING DUAL CELLS WITH DIFFERENT THICKNESS OF INTERPOSING SUBSTRATES, PHOTODETECTION DEVICE, LASER IMAGING DETECTION AND RANGING APPARATUS AND METHOD OF MANUFACTURING A PHOTODETECTOR

CROSS-REFERENCE TO RELATED APPLICATIONS

This application is based upon and claims the benefit of priority from the prior Japanese Patent Application No. 2017-180201, filed on Sep. 20, 2017, the entire contents of which are incorporated herein by reference.

FIELD

Embodiments described herein relate generally to a photodetector, a photodetection device, laser imaging detection and ranging apparatus and a method of manufacturing a photodetector.

BACKGROUND

A laser imaging detection and ranging (LIDAR) apparatus measures a time when laser light reciprocates to return from an object and reduces the time into a distance. The distance image sensing system employing a time-of-flight (TOF) distance measurement method is applied to an in-vehicle drive assist system, remote sensing, or the like.

As a problem of the photodetector used in the LIDAR apparatus, in a case where a difference in the amount of light from a subject is large, that is, in a case where a subject distance range is wide, light cannot be accurately detected. For example, in a case where the subject distance is short, the light amount of the reciprocating light increases. When the amount of incident light is too large, the photodetector is always in the photon-detected state, and thus, an SN ratio becomes low, so that the photodetector cannot accurately count photons. Therefore, in a case where the amount of light is large, the photodetector needs to detect incident light with low sensitivity. On the contrary, in a case where the subject distance is long, the light amount of the reciprocating light decreases. When the amount of incident light is too small, the photodetector cannot accurately count photons. Therefore, in a case where the amount of light is small, the photodetector needs to detect light incident with high sensitivity. Therefore, a photodetector capable of accurately detecting light even when a subject distance range is wide is required.

SUMMARY

The embodiment of the invention is to provide a photodetector, a LIDAR apparatus, and a method of manufacturing a photodetector that accurately detect light even when a subject distance range is wide.

In order to achieve the above object, a photodetector according to an embodiment includes a first cell for converting incident light into electric charges, the first cell including a first semiconductor layer, a second semiconductor layer and a first substrate interposing the first semiconductor layer with the second semiconductor layer; and a second cell for converting incident light into electric charges, the second cell including a third semiconductor layer, a fourth semiconductor layer, and a second substrate interposing the third semiconductor layer with the fourth semiconductor layer; wherein the second substrate is larger in thickness than the first substrate.

DETAILED DESCRIPTION

Hereinafter, embodiments of the invention will be described with reference to the drawings. Components denoted by the same reference numerals indicate corresponding ones. The drawings are schematic or conceptual, and a relationship between thickness and width of each portion, a ratio of sizes among portions, and the like are not necessarily the same as actual ones. In addition, even in the case of representing the same portions, the sizes and ratios of the portions may be different from each other depending on figures in the drawings.

First Embodiment

Figure 1:
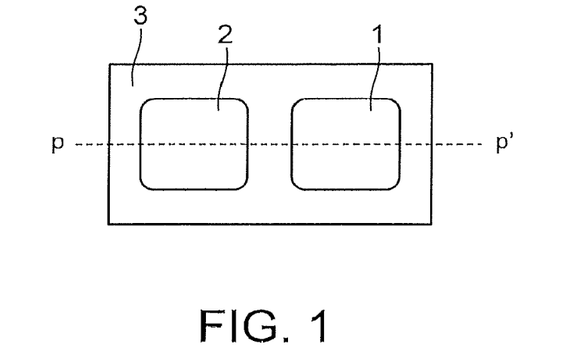
FIG. 1 is a diagram illustrating a photodetector according to a first embodiment.

FIG. 1 is a diagram of a photodetector according to a first embodiment as viewed from a light incident direction.

As illustrated in FIG. 1, the photodetector according to this embodiment includes a short-distance cell 1 (sometimes, referred to as a first cell), a long-distance cell 2 (sometimes, referred to as a second cell), and a separation portion 3. In addition, the photodetector includes at least one short-distance cell 1 and at least one long-distance cell 2, each of which photoelectrically converts light (for example, near-infrared light) incident on each of the short-distance cell 1 and the long-distance cell 2 into electric charges and outputs the photoelectrically-converted electric signal to a driving/reading unit (not illustrated), so that light is detected.

The separation portion 3 is an area for preventing adjacent cells from interfering with each other, is an area in which light incident on the photodetector cannot be detected, and surrounds the short-distance cell 1 and the long-distance cell 2. The separation portion 3 is a wiring area for outputting the electric charges converted by the short-distance cell 1 and the long-distance cell 2 to the driving/reading unit (not illustrated). The material of the wiring is, for example, aluminum, an aluminum-containing material, or other metal materials combined with the material.

Figure 2:
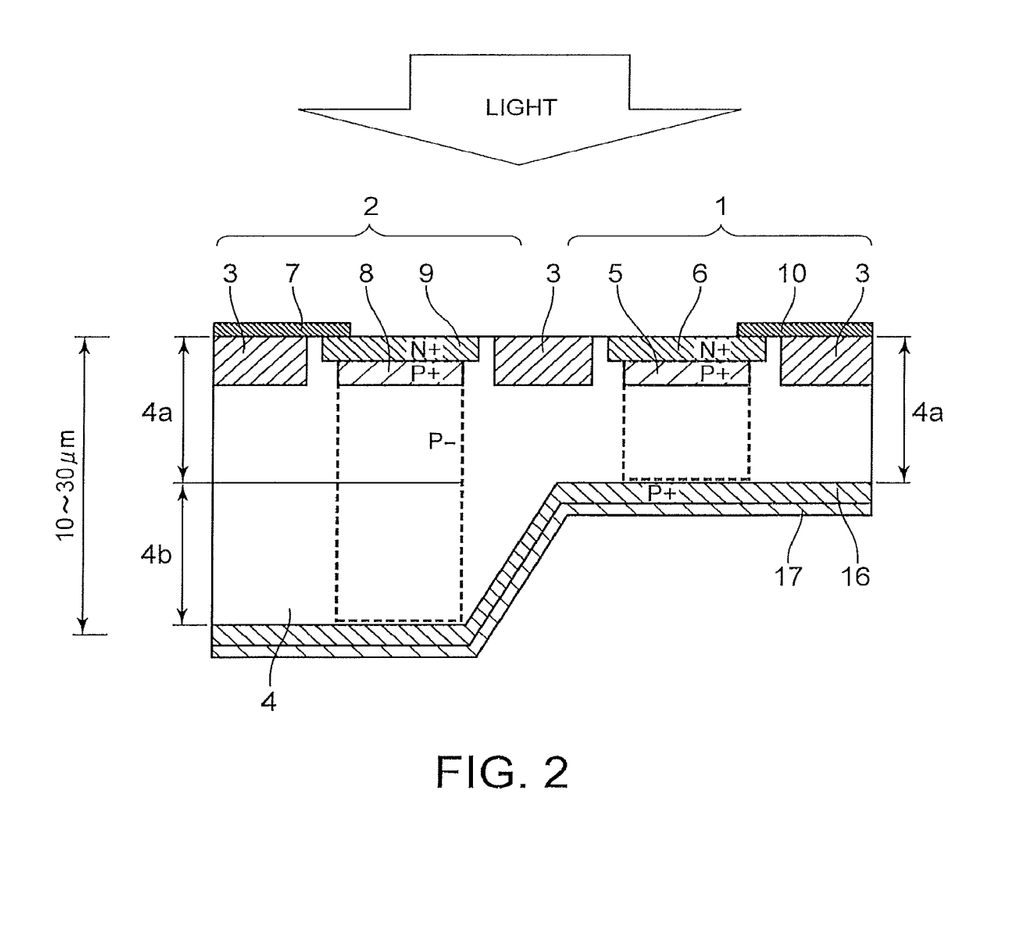
FIG. 2 is a diagram illustrating a p-p' cross section of the photodetector illustrated in FIG. 1.

FIG. 2 is a diagram illustrating a p-p' cross section of the photodetector illustrated in FIG. 1. In the photodetector according to this embodiment, although light may be incident from the lower side, it is assumed in FIG. 2 that light is incident from the upper side.

The short-distance cell 1 is, for example, an avalanche photodiode (APD) cell using a silicon material that detects light by converting incident light into electric charges. The short-distance cell 1 detects light with low sensitivity (sometimes, referred to as first sensitivity) when the amount of incident light is larger than a predetermined light amount. As illustrated in FIG. 2, the short-distance cell 1 includes a substrate 4, a first semiconductor layer 5 (for example, a p-type semiconductor layer) provided on the light incident side of the substrate 4, a second semiconductor layer 6 (for example, an n-type semiconductor layer) provided on the light incident side of the first semiconductor layer 5, a first electrode 10 electrically connected to an upper end portion of the second semiconductor layer 6, a visible light cut layer 16 provided on the back surface side facing the light incident side of the substrate 4, and a back-surface electrode 17 provided on the back surface side of the visible light cut layer 16. The "upper" denotes, for example, the light incident side in FIG. 2. In other words, the short-distance cell 1 includes a first semiconductor layer 5, a second semiconductor layer 6, a substrate 4 interposing the first semiconductor layer 5 with the second semiconductor layer 6, a visible light cut layer 16 interposing the substrate 4 with the first semiconductor layer 5, and a back-surface electrode 17 interposing the visible light cut layer 16 with the substrate 4. The first electrode 10 is electrically connected to the wiring of the separation portion 3. In addition, a depletion layer 4a that converts incident light into electric charges is formed inside the substrate 4 of the short-distance cell 1.

The long-distance cell 2 is, for example, an APD using a silicon material which detects light by converting incident light into electric charges. The long-distance cell 2 detects light with high sensitivity (second sensitivity) when the amount of incident light is smaller than a predetermined light amount. As illustrated in FIG. 2, the long-distance cell 2 includes a substrate 4, a third semiconductor layer 8 (for example, a p-type semiconductor layer) provided on the light incident side of the substrate 4, a fourth semiconductor layer 9 (for example, an n-type semiconductor layer) provided on the light incident side of the third semiconductor layer 8, a second electrode 7 electrically connected to an upper end portion of the fourth semiconductor layer 9, a visible light cut layer 16 provided on the back surface side of the substrate 4, and a back-surface electrode 17 provided on the back surface side of the visible light cut layer 16. In other words, the long-distance cell 2 includes the third semiconductor layer 8, the fourth semiconductor layer 9, the substrate 4 interposing the third semiconductor layer 8 with the fourth semiconductor layer 9, the visible light cut layer 16 interposing the substrate 4 with the third semiconductor layer 8, and the back-surface electrode 17 interposing the visible light cut layer 16 with the substrate 4. The second electrode 7 is electrically connected to the wiring of the separation portion 3. In this embodiment, the substrate 4, the back-surface electrode 17, and the visible light cut layer 16 of the short-distance cell 1 are the same as those of the long-distance cell 2.

The position in the stacking direction of the interface (sometimes, referred to as a pn junction plane) between the first semiconductor layer 5 and the second semiconductor layer 6 is substantially the same as that of the interface (sometimes, referred to as the pn junction plane) between the third semiconductor layer 8 and the fourth semiconductor layer 9. Herein, the stacking direction is a direction perpendicular to the surface. With respect to the thickness of the substrate 4 in the short-distance cell 1 and the long-distance cell 2 in the stacking direction, the thickness of the substrate 4 of the long-distance cell 2 is larger than the substrate 4 of the short-distance cell 1. That is, there is a step difference on the back surface side between the short-distance cell 1 and the long-distance cell 2. In the long-distance cell 2, a depletion layer 4a that photoelectrically convert incident light into electric charges and a non-depletion layer 4b are formed inside the substrate 4. On the other hand, as described above, in the short-distance cell 1, only the depletion layer 4a is formed, but the non-depletion layer 4b is not formed.

The first semiconductor layer 5 and the third semiconductor layer 8 are obtained, for example, by implanting impurities of boron (B) into silicon.

The second semiconductor layer 6 and the fourth semiconductor layer 9 are obtained, for example, by implanting impurities of phosphorus (P), antimony (Sb) or arsenic (As) into silicon.

The first electrode 10 and the second electrode 7 are provided to apply voltages to the first semiconductor layer 5, the second semiconductor layer 6, the third semiconductor layer 8, and the fourth semiconductor layer 9 to drive the short-distance cell 1 and the long-distance cell 2, so that the electric charges photoelectrically converted by the short-distance cell 1 and the long-distance cell 2 are transmitted to the driving/reading unit (not illustrated). The material of the first electrode 10 and the second electrode 7 is, for example, aluminum or an aluminum-containing material, or other metal materials combined with the material.

The visible light cut layer 16 is provided to cut visible light which is a cause of noise generation. The visible light cut layer 16 is an impurity layer into which, for example, boron (B) having a high concentration (concentration>$10^{18}$) is implanted.

The back-surface electrode 17 is provided for applying a voltage to the first semiconductor layer 5, the second semiconductor layer 6, the third semiconductor layer 8 and the fourth semiconductor layer 9. As the material of the back-surface electrode 17, for example, aluminum or an aluminum-containing material, or other metal materials combined with the material is used. The thickness of the substrate 4 is preferably 3 µm or less on the short-distance cell 1 side and preferably 10 to 30 µm on the long-distance cell 2 side.

Next, a photodetection operation of the photodetector having the short-distance cell 1 and the long-distance cell 2 will be described.

In a detection standby state, a reverse voltage higher than a breakdown reverse voltage is applied to the APD included in each cell, and the APD is operated in a region called a Geiger mode. Since the gain of the APD during the Geiger mode operation is such high as $10^5$ to $10^6$, such weak light as one photon can be measured. A discharge phenomenon in which discharge is performed in this Geiger mode is called Geiger discharge.

Resistors are connected in series to each APD, and when one photon is incident and Geiger discharge is performed, since the amplification function by the pn junction terminates due to the voltage drop by the resistors, pulsed charges are obtained.

In a silicon photomultiplier (SiPM) with APD connected together, each APD performs this function. Therefore, in a case where Geiger discharge occurs in a plurality of APDs, for electric charges of one APD, a charge amount proportional to the number of APDs Geiger-discharged or electric charges of a pulse peak value is obtained. Therefore, since it is possible to measure the number of APDs Geiger-discharged from the charge, that is, the number of photons incident on the SiPM, so that it is possible to measure photons one by one.

When the same potential is applied to the short-distance cell 1 and the long-distance cell 2, since the pn junction planes in both the cells 2 and 3 are at substantially the same position in the stacking direction, the depletion layers 4a in both cells 2 and 3 are formed at the same position with the same thickness. At this time, the thickness of the substrate 4 in the short-distance cell 1 is set such that almost the entire short-distance cell 1 is depleted. The thickness of the substrate 4 in the short-distance cell 1 is, for example, 3 μm or less. On the other hand, since the thickness of the substrate 4 of the long-distance cell 2 is much larger than that of the substrate 4 of the short-distance cell 1, there exists a non-depletion layer 4b (non-depleted region).

Electric charges generated in the depletion layer 4a move to the pn junction plane by drift to be subjected to charge multiplication, so that fast response can be obtained. On the other hand, electric charges generated in the non-depletion layer 4b first flow into the depletion layer 4a by diffusion, and then, move to the pn junction plane likewise by drift to be subjected to charge multiplication, so that delayed response components are generated by the time taken by the diffusion. Therefore, in the short-distance cell 1 in which the non-depletion layer 4b does not substantially exist, the fast response can be expected. With respect to the amount of photoelectric conversion of the incident light, the long-distance cell 2 in which the non-depletion layer 4b exists can be expected to have high sensitivity than the short-distance cell 1. As described above, in a case where the amount of the incident light is large, it is preferable to use the short-distance cell 1 having low sensitivity but fast response, and in a case where the amount of the incident light is small, it is preferable to use the long-distance cell 2 having slow response but high sensitivity.

Figure 3:
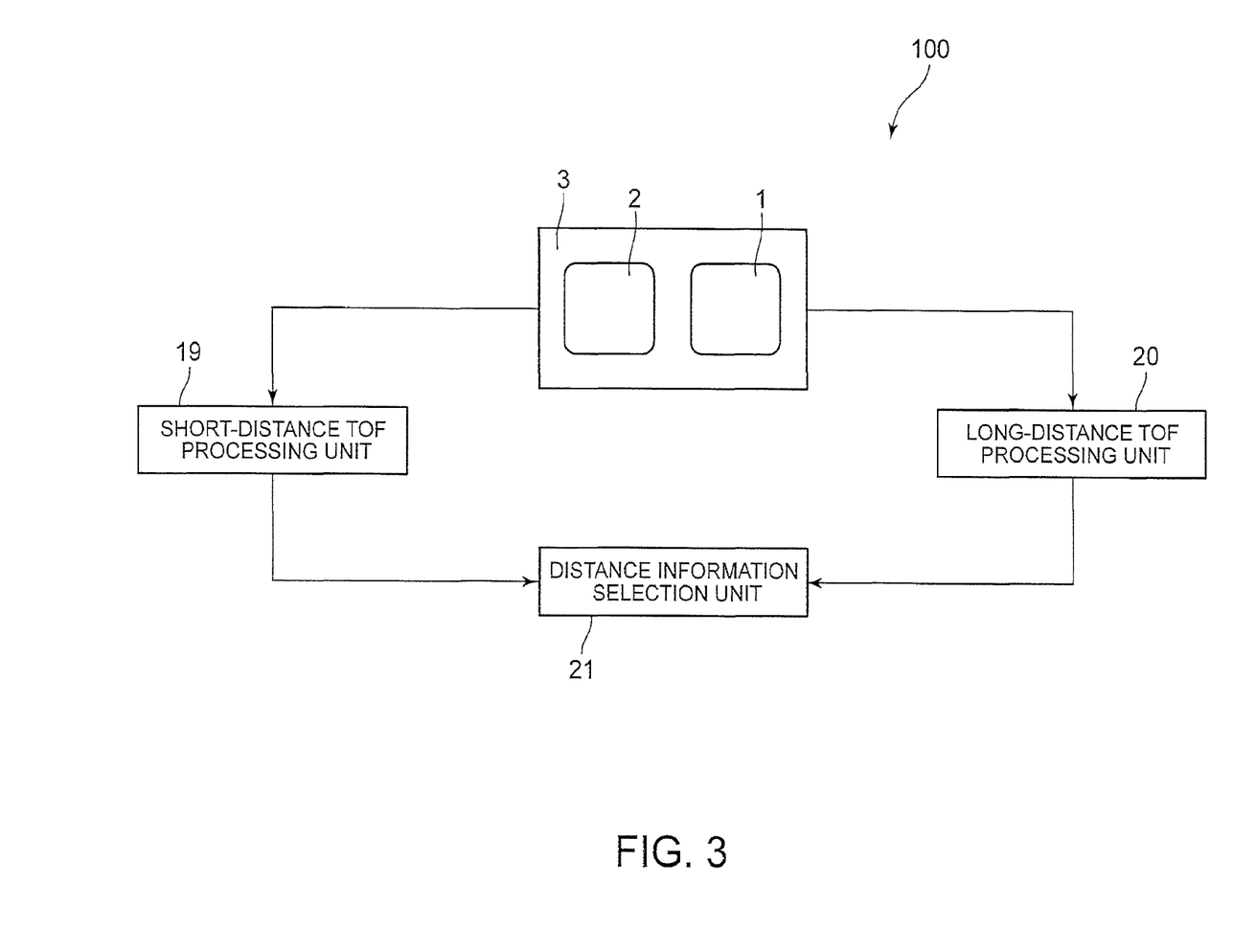
FIG. 3 is a diagram illustrating a photodetection device including the photodetector according to the first embodiment.

FIG. 3 is a diagram illustrating a photodetection device 100 including the photodetector according to the first embodiment.

As illustrated in FIG. 3, the short-distance cell 1 is connected to the short-distance TOF processing unit 19 (sometimes, referred to as a first processor) through the wiring of the separation portion 3. The short-distance TOF processing unit 19 calculates charges from the short-distance cell 1 as distance information by using TOF. The calculated distance information is transmitted to the distance information selection unit 21 (sometimes, referred to as a distance information selector). In addition, the long-distance cell 2 is connected to the long-distance TOF processing unit 20 (sometimes, referred to as a second processor) through the wiring of the separation portion 3. The long-distance TOF processing unit 20 calculates charges from the long-distance cell 2 as distance information by using the TOF. The calculated distance information is transmitted to the distance information selection unit 21. The distance information selection unit 21 selects, for example, one having a higher SN ratio from among the distance information of the short-distance cell 1 and the distance information of the long-distance cell 2. An image can be generated by using the selected distance information.

Figure 4:
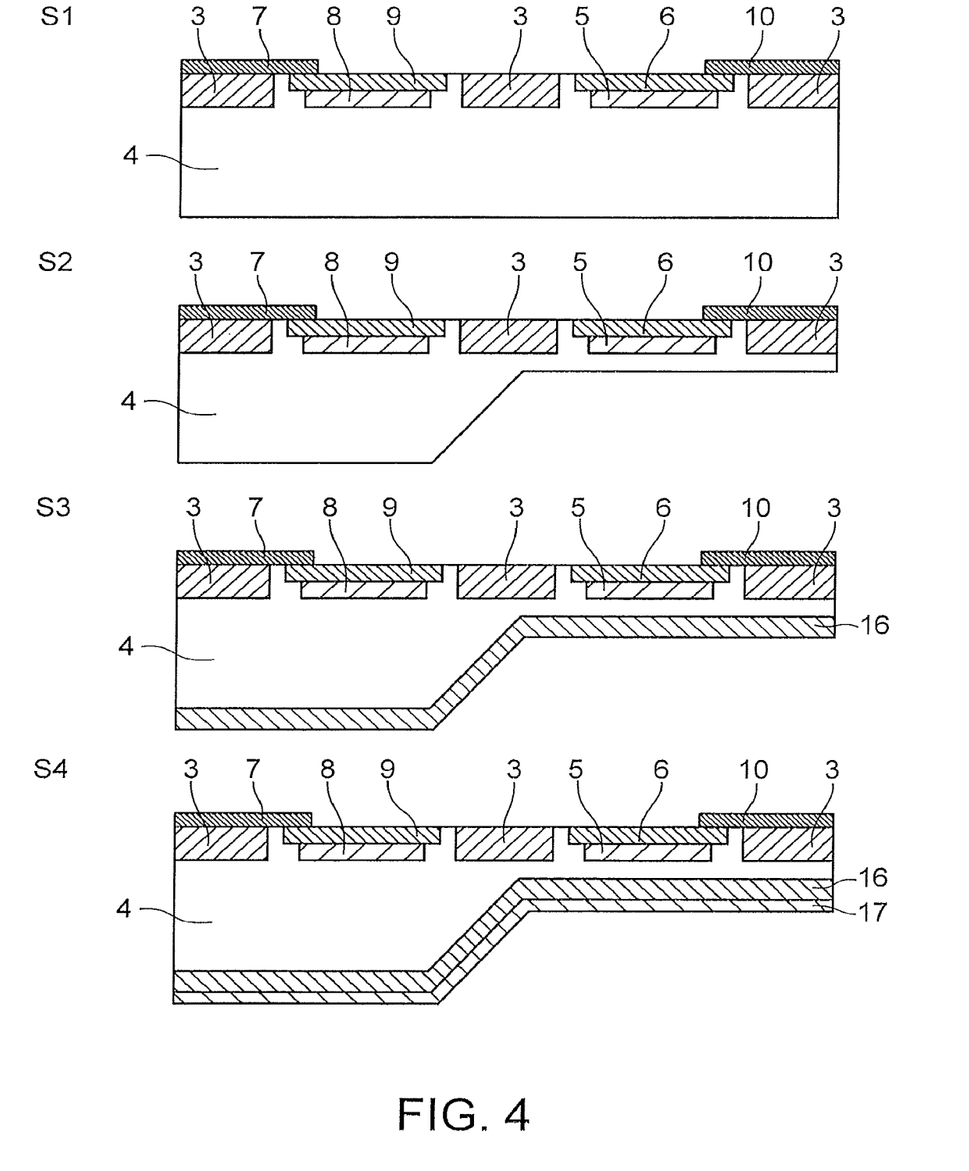
FIG. 4 is a diagram illustrating a method of manufacturing the photodetector according to the first embodiment.

A method of manufacturing the photodetector according to this embodiment will be described with reference to FIG. 4.

First, by using ion implantation, a first semiconductor layer 5 and a third semiconductor layer 8 are formed at a predetermined depth in a substrate 4. After that, by using ion implantation in the substrate 4, a second semiconductor layer 6 is formed above the first semiconductor layer 5, and a fourth semiconductor layer 9 is formed above the third semiconductor layer 8. A separation portion 3 is formed on the substrate 4 by performing ion implantation between the semiconductor layers 5 and 6 and the semiconductor layers 8 and 9. After forming a mask (not illustrated) having a predetermined shape above the substrate 4, the semiconductor layers 6 and 9, and the separation portion 3, electrodes 7 and 10 are formed by chemical vapor deposition (CVD) so that the separation portion 3 and the second semiconductor layer 6 are bridged and the separation portion 3 and the fourth semiconductor layer 9 are bridged. After that, the mask is removed (step S1).

Next, a step difference is formed on the substrate 4. A mask (not illustrated) having a predetermined shape is formed on the back surface side of the substrate 4. This mask is formed on only the side of the substrate closer to the semiconductor layers 8 and 9. After that, the back surface of the substrate is etched by reactive ion etching (RIE), and thus, the back surface side of the substrate closer to the semiconductor layers 5 and 6 is etched, and the thickness of the substrate 4 closer to the semiconductor layers 8 and 9 is larger than that of the substrate closer to the semiconductor layer 5 and 6, so that a step difference is formed. At this time, with respect to the thickness of the substrate 4 closer to the semiconductor layers 5 and 6, the RIE is performed in consideration of the thickness of the depletion layer 4a so that the inside thereof is substantially depleted. It is preferable to adjust the thickness of the substrate 4 closer to the semiconductor layers 5 and 6 to be 3 μm or less and to adjust the thickness of the substrate closer to the semiconductor layers 8 and 9 to be 10 to 30 μm. After that, the mask is removed (step S2).

Further, on the back surface, boron is ion-implanted at a high concentration, and then, heat treatment is performed to form the visible light cut layer 16 (step S3).

Furthermore, a back-surface electrode 17 is formed on the back surface by CVD (step S4).

By the processes described heretofore, the photodetector according to this embodiment can be manufactured.

The photodetector according to this embodiment includes the short-distance cell 1 and the long-distance cell 2 corresponding to the subject distance, so that even if the subject distance range is so wide that a general photodetector cannot accurately detect light, it is possible to accurately detect light.

Regardless of the example of FIG. 2, the substrate 4 may be completely separated by the separating portion 3 as the first substrate and the second substrate.

Regardless of the example of FIG. 3, the distance information of the short-distance cell 1 and the distance information of the long-distance cell 2 may be combined by the distance information selection unit 21 as one image. For example, WO 2012/073722 A discloses a synthesis method therefor.

Modification

Figure 5:
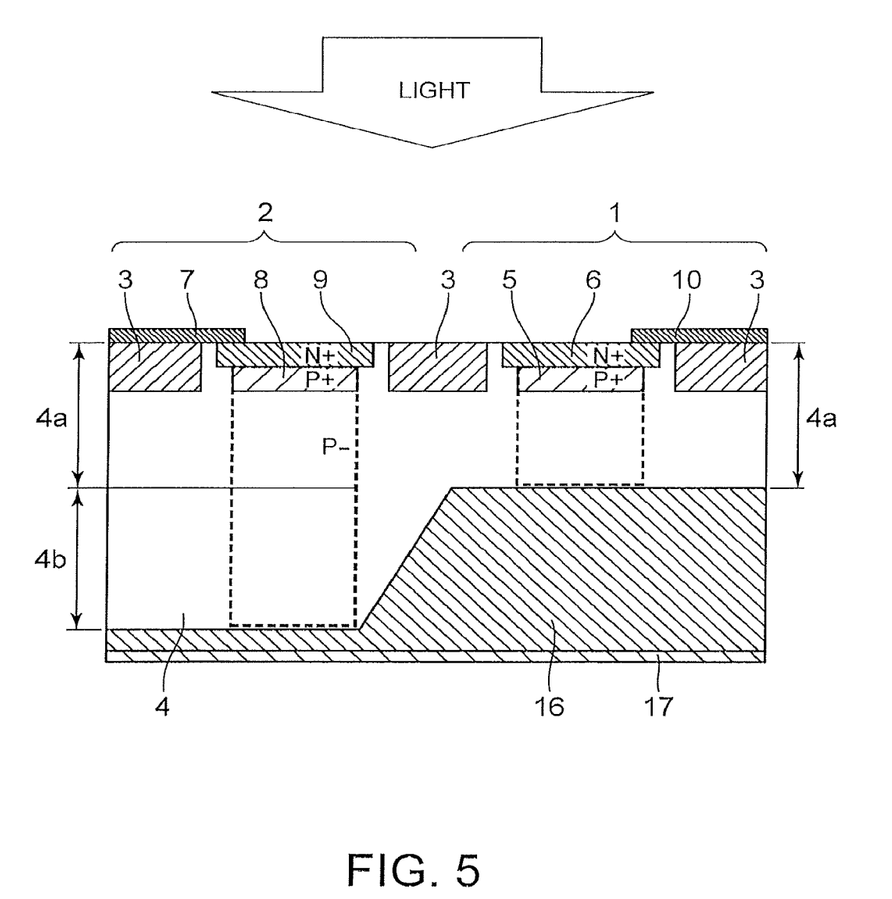
FIG. 5 is a diagram illustrating a modification of the photodetector according to the first embodiment.

FIG. 5 illustrates a modification of the photodetector according to the first embodiment.

In the modification, in order to allow the thickness of the photodetector including the short-distance cell 1 and the long-distance cell 2 to be uniform, the visible light cut layer 16 on the short-distance cell 1 side is formed thick. That is, the step difference between the short-distance cell 1 and the long-distance cell 2 is removed.

Generally, if there exists a step difference in the photodetector, there are many portions that are vulnerable to shocks occurring in the manufacturing process. However, in the modification, the visible light cut layer 16 closer to the short-distance cell 1 is formed thick to remove the step difference, so that it is possible to enhance strength against the impact.

Second Embodiment

Differences from the first embodiment will be described.

Figure 6:
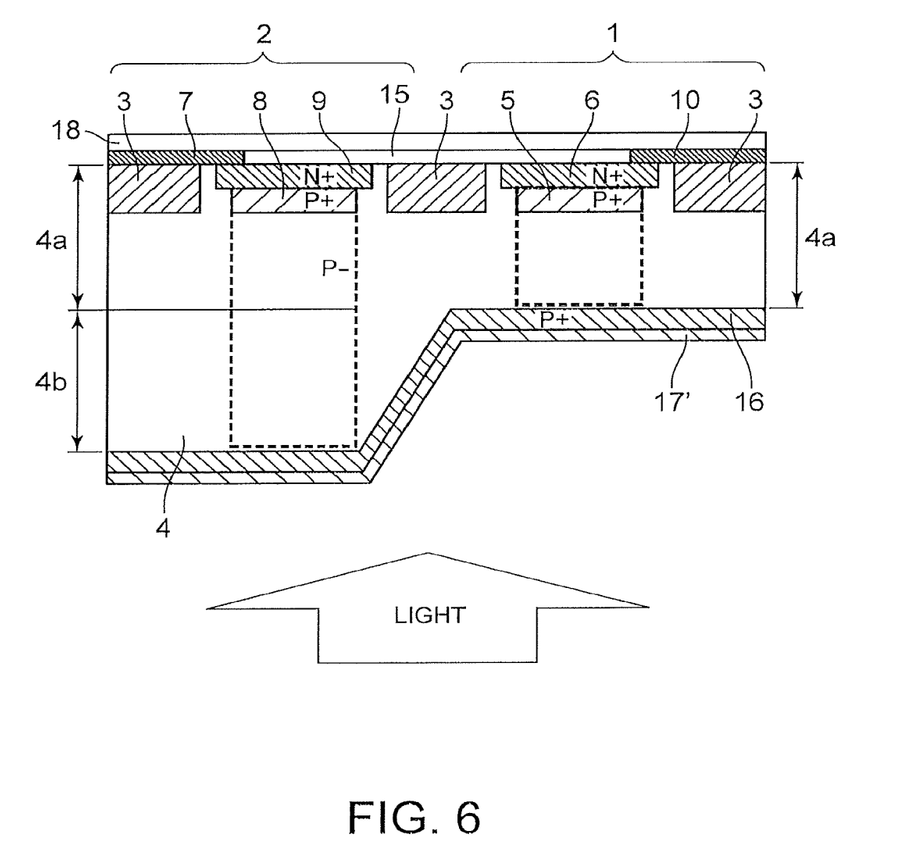
FIG. 6 is a diagram illustrating a p-p' cross section of another photodetector according to a second embodiment.

FIG. 6 is a diagram illustrating a p-p' cross section of another photodetector according to the second embodiment. In FIG. 6, it is assumed that light is incident from the lower side.

The photodetector according to the second embodiment includes a reflective layer 18 that reflects light and a light transmissive resin layer 15 that transmits light. In this embodiment, the reflective layer 18 is provided on the side opposite to the light incident sides of the short-distance cell 1 and the long-distance cell 2, and the light transmissive resin layer 15 is provided between the short-distance cell 1 and the reflective layer 18 and between the long-distance cell 2 and the reflective layer 18. In a case where light is incident from the lower side, an electrode 17' using a transparent conductive film such as an indium tin oxide (ITO) is provided instead of the back-surface electrode 17.

The photodetector according to this embodiment has the reflective layer 18 so that the light that is not photoelectrically converted by the substrate 4 can be reflected by the reflective layer 18 to be incident on the substrate 4 again. Therefore, the light is incident on the substrate 4, and thus, photoelectric conversion can be performed again, so that it is possible to obtain the photodetector having high sensitivity.

Third Embodiment

Figure 7:
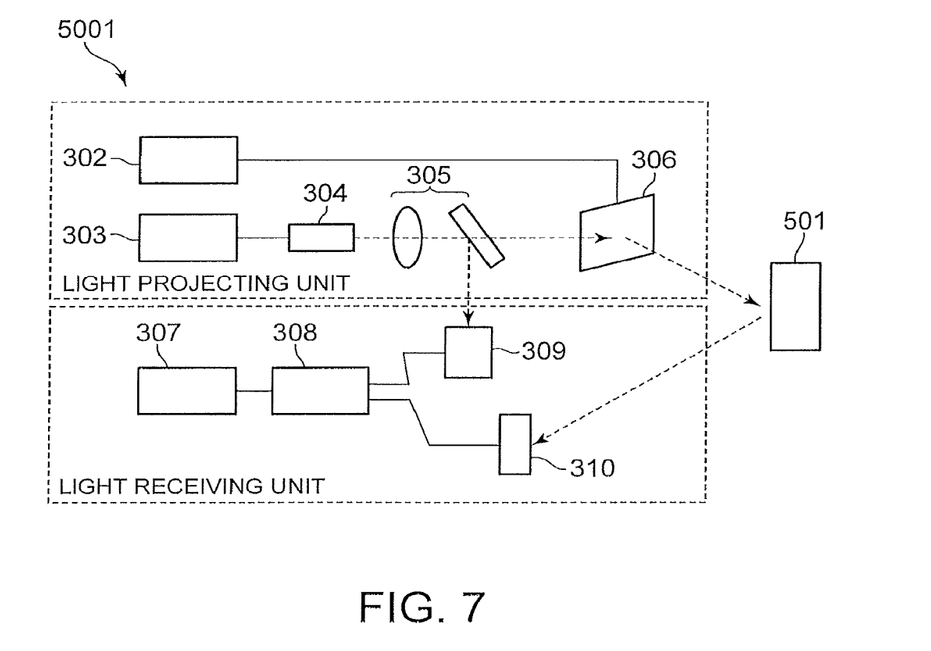
FIG. 7 is a diagram illustrating a LIDAR apparatus according to a third embodiment.

FIG. 7 is a diagram illustrating a LIDAR apparatus 5001 according to the third embodiment.

The LIDAR apparatus 5001 according to this embodiment can be applied to a long-distance subject detection system configured with a line light source, a lens, and the like. The LIDAR apparatus 5001 includes a light projecting unit which projects laser light to the object 501, a light receiving unit which receives the light from the object 501, and a time-of-flight (TOF) distance measurement device (not illustrated) which measures a time when the laser light reciprocates to return from the object 501 and reduces the time to a distance.

In the light projecting unit, the laser light oscillator 304 oscillates laser light. A driving circuit 303 drives the laser light oscillator 304. The optical system 305 extracts a portion of the laser light as a reference light and irradiates the object 501 with the other laser light through the mirror 306. The mirror controller 302 controls the mirror 306 to project the laser light onto the object 501. Herein, projecting denotes irradiating with light.

In the light receiving unit, the reference-light photodetector 309 detects the reference light emitted by the optical system 305. The photodetector 310 receives reflected light from the object 501. The distance measurement circuit 308 measures the distance to the object 501 based on the difference between the time when the reference-light photodetector 309 detects the reference light and the time when the photodetector 310 detects the reflected light. The image recognition system 307 recognizes the object 501 based on a result measured by the distance measurement circuit 308.

The LIDAR apparatus 5001 is a distance image sensing system employing a time-of-flight (TOF) distance measurement method which measures a time when the laser light reciprocates to return from the object 501 and reduces the time into a distance. The LIDAR apparatus 5001 is applied to an in-vehicle drive-assist system, remote sensing, or the like. When the photodetectors according to the first embodiment and the second embodiment are used as the photodetector 310, the photodetector exhibits good sensitivity particularly in a near infrared region. Therefore, the LIDAR apparatus 5001 can be applied to alight source to a wavelength band invisible to a person. For example, the LIDAR apparatus 5001 can be used for detecting obstacles for vehicles.

Figure 8:
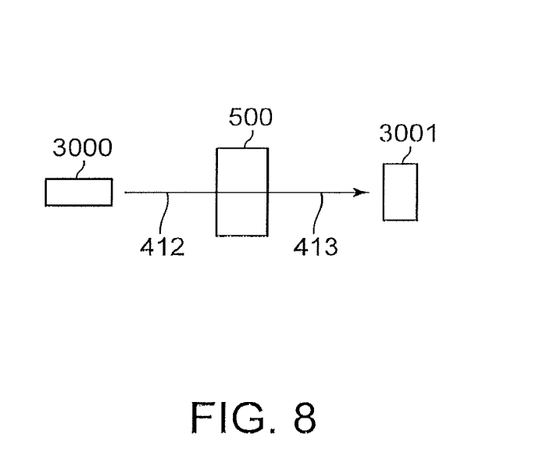
FIG. 8 is a diagram illustrating a measurement system of the LIDAR apparatus of FIG. 7.

FIG. 8 is a diagram illustrating the measurement system.

The measurement system includes at least a photodetector 3001 and a light source 3000. The light source 3000 of the measurement system emits light 412 to the object 501 to be measured. The photodetector 3001 detects the light 413 transmitted through, reflected by, or diffused by the object 501.

For example, when the photodetector 3001 is used as the photodetectors according to the first embodiment and the second embodiment, a highly sensitive measurement system is embodied.

While several embodiments of the invention have been described above, the above-described embodiments have been presented byway of examples only, and the embodiments are not intended to limit the scope of the invention. The embodiments described herein may be embodied in a variety of other forms; furthermore, various omissions, substitutions, and changes in the form of the embodiments described herein may be made within the scope without departing from the spirit of the invention. The embodiments and modifications thereof are included in the scope and spirit of the invention and fall within the scope of the invention described in the claims and the equivalents thereof.

What is claimed is:

1. A photodetector comprising:
a first cell for converting incident light into electric charges, the first cell including a first semiconductor layer, a second semiconductor layer and a first substrate interposing the first semiconductor layer with the second semiconductor layer; and
a second cell for converting incident light into electric charges, the second cell including a third semiconductor layer, a fourth semiconductor layer, and a second substrate interposing the third semiconductor layer with the fourth semiconductor layer;
wherein a thickness of the second substrate is larger than that of the first substrate.

2. The photodetector of claim 1,
wherein the first cell detects light with a first sensitivity when the amount of incident light is larger than a predetermined light amount and the second cell detects light with a second sensitivity when the amount of incident light is smaller than the predetermined light amount.

3. The photodetector of claim 2,
wherein the first substrate includes a depletion layer and the second substrate includes the depletion layer and a non-depletion layer.

4. The photodetector of claim 3, further comprising:
a visible light cut layer interposing the first substrate with the first semiconductor layer and the second substrate with the third semiconductor; and
a back-surface electrode interposing the visible light cut layer with the first substrate and the second substrate.

5. The photodetector of claim 4,
wherein the first substrate and the second substrate are the same.

6. The photodetector of claim 5,
wherein the thickness of the first substrate is 10 to 30 μm.

7. The photodetector of claim 6,
wherein the thickness of the second substrate is 3 μm or less.

8. The photodetector of claim 7,
wherein the light is near-infrared light.

9. The photodetector of claim 8,
wherein if light is incident from the second semiconductor side and the forth semiconductor side to the first substrate and the second substrate, a material of the back-surface electrode is aluminum, an aluminum-containing material or other metal materials combined with the aluminum or the aluminum-containing material.

10. The photodetector of claim 8,
wherein if light is incident from the back-surface electrode side to the first substrate and the second substrate, a material of the back-surface electrode is an indium tin oxide.

11. A photodetection device comprising,
a photodetector including a first cell converting incident light into electric charges and a second cell converting incident light into electric charges, wherein the first cell includes a first semiconductor layer a second semiconductor layer and a first substrate interposing the first semiconductor layer with the second semiconductor layer, and the second cell includes a third semiconductor layer a fourth semiconductor layer and a second substrate interposing the third semiconductor layer with the fourth semiconductor layer and the second substrate is larger in thickness than the first substrate;
a first processor calculating charges from the first cell as distance information;
a second processor calculating charges from the second cell as distance information and
a distance information selector for selecting the calculated distance information by the first processor and the second processor.

12. A LIDAR apparatus comprising:
a light source emitting light to an object; and
a first cell converting incident light reflected by the object into electric charges; and
a second cell converting incident light reflected by the object into electric charges; and
wherein the first cell includes a first semiconductor layer a second semiconductor layer and a first substrate interposing the first semiconductor layer with the second semiconductor layer and the second cell includes a third semiconductor layer a fourth semiconductor layer and a second substrate interposing the third semiconductor layer with the fourth semiconductor layer; and the second substrate is larger in thickness than the first substrate.

* * * * *